(12) United States Patent
Hezar

(10) Patent No.: US 6,864,818 B1
(45) Date of Patent: Mar. 8, 2005

(54) PROGRAMMABLE BANDPASS ANALOG TO DIGITAL CONVERTER BASED ON ERROR FEEDBACK ARCHITECTURE

(75) Inventor: Rahmi Hezar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/731,493

(22) Filed: Dec. 9, 2003

(51) Int. Cl.$^7$ .............................................. H03M 3/00
(52) U.S. Cl. ..................................................... 341/143
(58) Field of Search ................................ 341/143, 155, 341/159

(56) References Cited

U.S. PATENT DOCUMENTS

| | | | |
|---|---|---|---|
| 5,027,120 A | * | 6/1991 | Thurston .................... 341/143 |
| 5,065,157 A | | 11/1991 | Ribner et al. |
| 5,103,229 A | | 4/1992 | Ribner |
| 5,181,032 A | | 1/1993 | Ribner |
| 5,283,578 A | | 2/1994 | Ribner et al. |
| 5,305,004 A | | 4/1994 | Fattaruso |
| 5,341,135 A | * | 8/1994 | Pearce ......................... 341/120 |
| 5,442,353 A | * | 8/1995 | Jackson ....................... 341/143 |
| 5,500,645 A | | 3/1996 | Ribner et al. |
| 5,952,947 A | | 9/1999 | Nussbaum et al. |
| 6,148,048 A | | 11/2000 | Kerth et al. |
| 6,611,221 B1 | | 8/2003 | Soundarapandian et al. |
| 6,642,874 B1 | | 11/2003 | Lin et al. |

OTHER PUBLICATIONS

"A Direct Digital Synthesizer with a tunable Error Feedback Structure", Jouko, Jankka, IEEE Transactions on Communications, vol. 45, No. 4, Apr., 1997, pp. 416–420.
"A Noise–Shaping Coder Topology for 15+ Bit Converters", L. Richard Carley, IEEE Journal of Solid–State Circuits, vol. 24, No. 2, Apr., 1989, pp. 267–273.
"Multibit Σ–Δ A/D Converter Incorporating A Novel Class of Dynamic Element Matching Techniques", Bosco H. Leung and Schat Sutarja, IEEE Transactions on Circuits and Systems, Analog and Digital Signal Processing, vol. 39, No. 1, Jan., 1992, pp. 35–51.
"A 1.5V 2.4/2.9mW 79/50dB DR Sigma Delta Modulator for GSM/WCDMA in a 0.13um Digital Process", G. Gomez and B. Haroun, Solid State Circuits Conference, Digest of Technical Papers, vol. 1, pp. 306–307, Feb. 2002 San Francisco, CA, and Visuals Supplement, pp. 242, 243, 490. Institute of Electrical and Electronics Engineers, 2002 Digest of Technical Papers and Visuals Supplement 2002 to the Digest of Technical Papers, IEEE International Solid–State Circuits conference, vol. Forty–Five, ISSN 0193–6530, 13.3 "A Dual–Mode 80MHz Bandpass ΔΣ Modulator for a GSM/WCDMA IF–Receiver", T. Salo, T. Hollman, S. Lingfors and K. Halonen, 7 pgs.
"Behavioral Modeling of Seitched–Capacitor Sigma–Delta Modulators", Piero Malcovati, Simona Brigati, Fabrizio Francesconi, Franco Maloberti, Paolo Cusianato and Andrea Baschirotto, IEEE Transactions on Circuits and Systems: Fundamental Theory and Applications, vol. 50, No. 3, Mar., 2003, pp. 352–364.

* cited by examiner

*Primary Examiner*—Brian Young
(74) *Attorney, Agent, or Firm*—Wade James Brady, III; Frederick J. Telecky, Jr.

(57) ABSTRACT

A delta sigma modulator based analog to digital converter is presented, having a first quantizer and a digital error feedback system comprising a second quantizer and a digital bandpass noise shaping system. The second quantizer provides a second quantized output to the noise shaping system according to the first quantized output, the system analog input, and the noise shaped feedback signal. The digital noise shaping system provides a feedback signal to the first quantizer according to the second quantized output, where the feedback signal is bandpass noise shaped with respect to a quantization error of the first quantizer.

21 Claims, 11 Drawing Sheets

PROGRAMMABLE BANDPASS ANALOG TO DIGITAL CONVERTER BASED ON ERROR FEEDBACK ARCHITECTURE

FIELD OF INVENTION

The present invention relates generally to analog to digital conversion systems and more particularly to bandpass analog to digital converters and programmable bandpass delta sigma modulators therefor having digital error feedback noise shaping systems.

BACKGROUND OF THE INVENTION

Analog-to-digital (A/D) converters are electrical circuit devices that convert continuous signals, such as voltages or currents, from the analog domain to the digital domain where the signals are represented by numbers. A variety of A/D converter types exist, including flash A/Ds, sub-ranging A/Ds, successive approximation A/Ds, and integrating A/Ds. Another type is known as a sigma delta or delta sigma (e.g., $\Delta$-$\Sigma$) A/D converter that includes a delta sigma modulator operating as a type of noise shaping encoder, typically with a 1–3 bit quantized digital output. Delta sigma or sigma delta modulators are often used in mixed signal integrated A/D converters, because of their insensitivity to CMOS process linearity and matching problems when compared to other A/D converter types. These features make delta sigma based mixed signal solutions very attractive for a number of applications, such as audio, receiver channels of communication devices (wireless in particular), sensor interface circuits, and measurement systems.

Delta sigma converters are operated at a significantly higher sampling rate than the bandwidth of the analog input signal, a technique referred to as oversampling, wherein the analog input signal is sampled at a very high sampling rate in order to perform a noise shaping function. The oversampling is commonly performed at a multiple of the Nyquist rate ($F_N$) for a given input signal frequency content (e.g., sampling frequency $F_S$ is often 10 to 1000 times $F_N$), wherein quantization noise power is spread over a bandwidth equal to the sampling frequency, thereby reducing the noise density in the band of interest. A noise shaping or loop filter, typically a lowpass filter (e.g., integrator), is commonly provided in the forward signal path of the delta sigma modulator to push some of the quantization noise into the higher frequency spectrum beyond the band of interest. Digital filtering is performed on the oversampled digital output to achieve a high resolution, and decimation is employed to reduce the effective sampling rate back to the "Nyquist" rate.

In addition to traditional lowpass loop filters, delta sigma modulators often include bandpass loop filters where a signal of interest lies within a certain frequency band. For example, in wireless communications devices, bandpass delta sigma A/D converters are employed to ascertain a signal of interest in narrow or wide bands (e.g., Global Systems for Mobile communications (GSM), Code Division Multiple Access (CDMA), Wideband Code Division Multiple Access (WCDMA), etc.) using a bandpass loop filter to reduce noise outside the particular band of interest. In this regard, GSM applications typically involve channel bandwidths of 200 kHz, the Bluetooth CDMA standard corresponds to the 600 kHz and 1.0 MHz bandwidths, WCDMA and Bluetooth standards correspond to 2.0 and 3.0 MHz bandwidths, with video standards using even wider bands. Conventional delta sigma modulation based bandpass A/D converters implement the noise shaping transfer function for the loop filter using analog components, including inductors and other highly nonlinear circuit elements. These circuits, once constructed, are optimized for a fixed bandwidth and a fixed sampling frequency $F_S$, typically about 4 times the center frequency of the band of interest (e.g., the center frequency is about ¼ of $F_S$).

However, in certain receiver applications, different channels are located at different center frequencies. For example, switching from one channel to another in a GSM receiver requires changing the center frequency of the A/D converter loop filter. In conventional designs, this has been accomplished using a variable sampling clock frequency to address different frequency bands. Variable clocks, however, require complex phase locked loop (PLL) circuitry, thus increasing the circuit area occupied by the converter and the cost. In other situations, it is desirable to create a bandpass delta sigma modulator that may be used in both narrow band and wider band applications. For instance, the same bandpass A/D converter may need to convert signals in one or more narrow GSM bands, as well as in wider bands for CDMA and WCDMA applications. Conventional designs do not allow this flexible operation, since the analog bandpass loop filter poles and zeros (e.g., and hence the passband width) are fixed, making it difficult to address multiple application standards. Furthermore, analog bandpass filters for such delta sigma modulator applications include highly nonlinear components (e.g., inductors, etc.), which are difficult to implement in CMOS fabrication processes and integrators with stability shortcomings, high signal swings, high area usage, and high power consumption. Accordingly, there is a need for improved bandpass delta sigma modulators and A/D converters to allow operation with different bandwidths and center frequencies.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to bandpass A/D converters and delta sigma modulators wherein the bandpass noise shaping or filtering is performed digitally, which facilitates programmability with respect to bandwidth and center frequency using simple clock circuitry, with low power consumption, reduced circuit size, and wherein the noise shaping circuitry can be fashioned from linear components.

In one aspect of the invention, delta sigma based analog to digital conversion systems are provided, in which digital error feedback is used to perform noise shaping, such as digital bandpass filtering. The modulator comprises a first quantizer and a digital error feedback system, where the first quantizer provides a digital output based on the system analog input and a noise shaped feedback signal from the digital system. The error feedback system provides noise shaping, for example, digital bandpass filtering with programmable filter poles and zeros to address multiple applications, where the center frequency and/or bandwidth can be easily changed without complex PLL circuits and without nonlinear analog components. In one implementation illustrated below, the digital feedback system includes a high resolution second quantizer and a digital noise shaping system providing the noise shaped feedback signal.

The second quantizer provides a digital representation of the quantization error of the first quantizer, which is then noise shaped (e.g., bandpass filtered) by the noise shaping system. The programmable noise shaping can be provided by a plurality of digital bandpass filter systems having different filter pole and zero locations, with a multiplexer providing the noise shaped output from a selected filter as the feedback signal.

The following description and annexed drawings set forth in detail certain illustrative aspects and implementations of the invention. These are indicative of only a few of many ways in which the principles of the invention may be employed.

DETAILED DESCRIPTION OF THE INVENTION

Figure 1A:
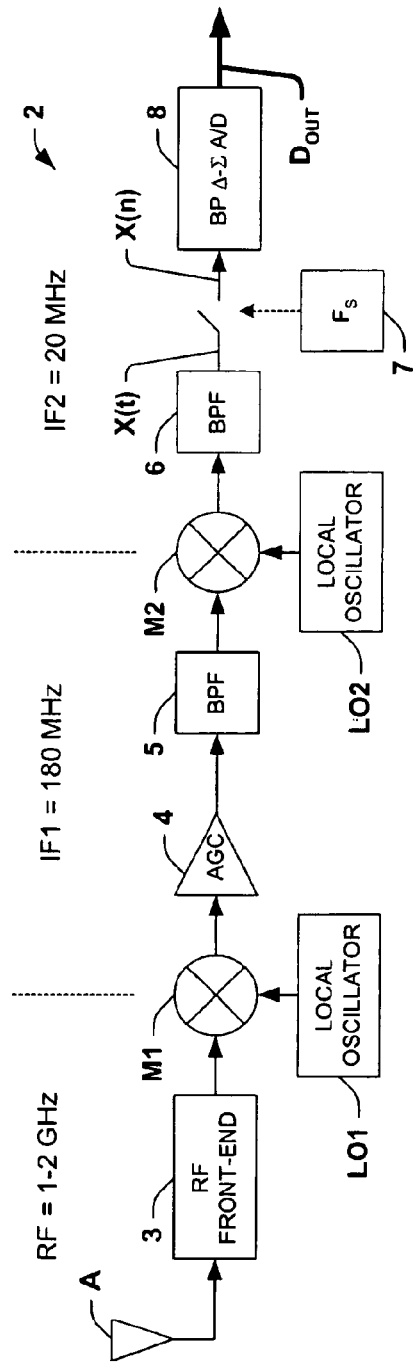
FIG. 1A is a schematic diagram illustrating a wireless receiver system with a bandpass delta sigma A/D converter in which the various aspects of the invention may be carried out.

One or more implementations of the present invention will now be described with reference to the attached drawings, wherein like reference numerals are used to refer to like elements throughout. The invention relates to analog to digital converters that may be employed in receiver circuits for wireless communications devices or other applications, wherein digital noise shaping is used to provide bandpass or other filtering.

Figure 1B:
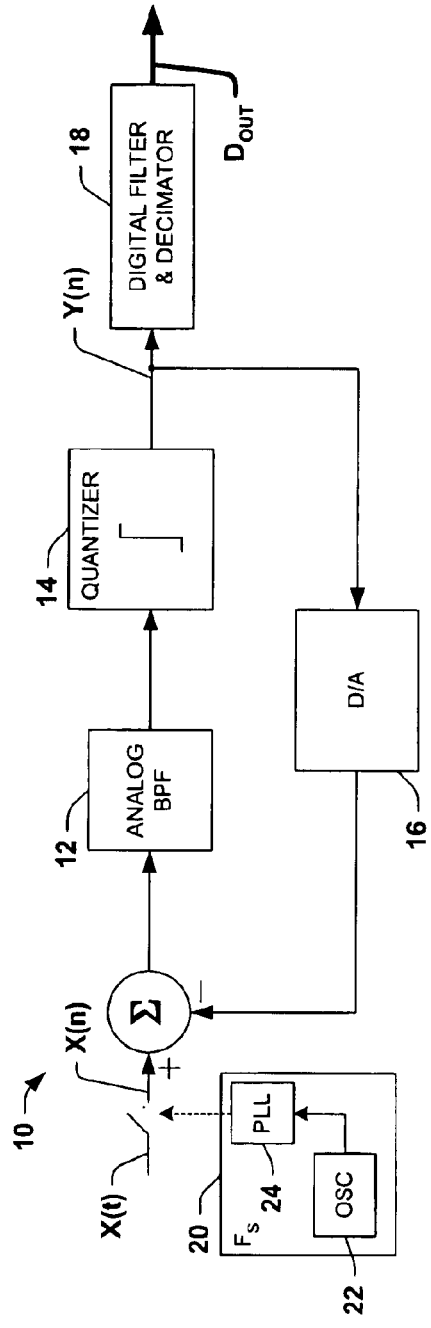
FIG. 1B is a schematic diagram illustrating a conventional bandpass delta sigma A/D converter having an analog bandpass loop filter.

Referring initially to FIGS. 1A and 1B, the invention is hereinafter illustrated in the context of wireless receiver circuits, wherein bandpass delta sigma A/D converters are employed at a low intermediate frequency of 20 MHz, although the invention is not limited to the illustrated examples and may be employed in any A/D conversion systems. FIG. 1A provides a simplified illustration of an exemplary heterodyne receiver 2 for a wireless communication device. The receiver system 2 includes an RF antenna "A" coupling a received signal (e.g., 1 to 2 GHz in this example) to an RF front-end circuit 3 that may include a band select filter to remove out-of-band signals and noise. A first mixer M1 down-converts the signal to a first intermediate frequency IF1 of 180 MHz using a first local oscillator LО1, and an automatic gain control (AGC) amplifier 4 ensures the signal amplitude is bounded. A first bandpass filter 5 provides a bandpass filtered signal to a second mixer M2 that further down-converts the signal to a second intermediate frequency IF2 of 20 MHz using a second local oscillator LО2, after which a second bandpass filter 6 removes out-of-band noise. The filtered signal $X(t)$ is sampled at a sampling frequency $F_S$ 7 and the sampled signal $X(n)$ is provided to a bandpass delta sigma A/D converter 8, which provides a digital output $D_{OUT}$ representative of the signal $X(t)$.

FIG. 1B illustrates a conventional bandpass delta sigma converter 10 including an analog bandpass loop filter 12, a single or multi-bit quantizer 14, and a digital to analog (D/A) feedback converter 16 in a closed loop forming a delta sigma modulator. The analog loop filter 12 filters the difference between the input $X(n)$ and a feedback signal from the feedback converter 16 to perform a bandpass noise shaping function. The quantizer 14 converts the filtered analog signal to a digital output $Y(n)$, and the feedback D/A converter 16 converts the quantized digital output $Y(n)$ to analog form, which is provided as the feedback signal to the filter 12. The quantized output $Y(n)$ is oversampled, including a series of ones and zeros where the mean of all the data points $Y(n)$ is representative of the analog input signal $X(t)$. The output $Y(n)$ is fed to a digital filter and decimation system 18 that reduces the bandwidth by averaging the samples $Y(n)$ (e.g., lowpass filter).

The conventional converter 10 provides a noise shaping transfer function using analog components, including amplifiers, inductors and other highly nonlinear circuit elements, where the filter 12 is designed for a fixed bandwidth and a fixed sampling frequency $F_S$, typically about 80 MHz (e.g., 4 times the IF2 center frequency of 20 MHz). However, as discussed above, accommodating multiple channels in a GSM system requires the receiver 2 of FIG. 1A to accept signals at different center frequencies. To switch from one channel to another in a GSM receiver 2, the converter 10 includes a variable sampling clock $F_S$ 20 with an oscillator 22 and a variable PLL 24. The use of a variable PLL increases the circuit area occupied by the converter 10 and the cost. Furthermore, the passband width of the analog filter 12 is fixed, making the converter 10 unable to be selectively used for both narrow and wideband applications. In addition, the analog bandpass filter 12 includes inductors, which are difficult to implement in CMOS fabrication processes, and amplifiers that may suffer from instability, high signal swings, and high power consumption. Moreover, the circuit area occupied by the analog loop filter 12 and the variable PLL 24 is high.

FIGS. 2A–3D illustrate an exemplary bandpass delta sigma A/D conversion system 100 that employs digital error feedback with digital bandpass noise shaping in accordance with the present invention. Although illustrated as a continuous time circuit receiving the analog signal $X(t)$ (e.g., from the filter 6 or directly from the second mixer M2 in FIG. 1A), sampling may be employed at the converter input to provide a sampled signal $X(n)$, wherein the digital noise shaping of the invention allows sampling at a fixed rate (e.g., 80 Hz in the illustrated example where the intermediate frequency IF2 is 20 MHz).

Figure 2A:
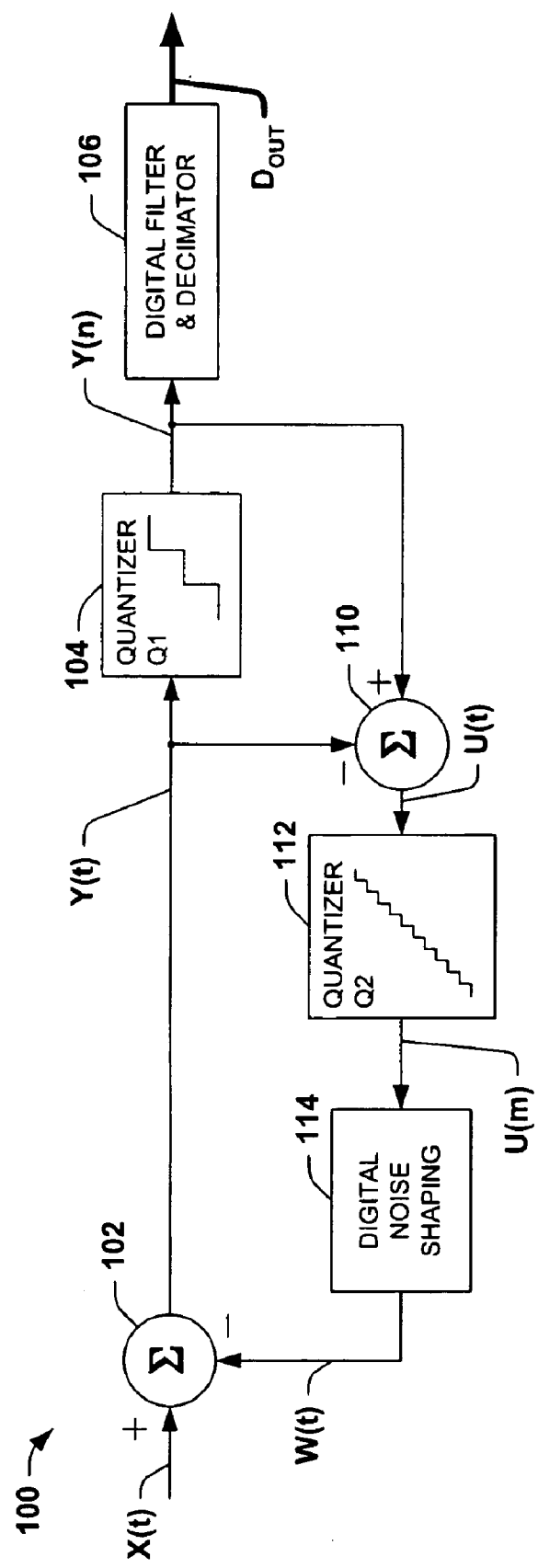
FIG. 2A is a schematic diagram illustrating an exemplary bandpass delta sigma analog to digital conversion system comprising digital error feedback with digital bandpass noise shaping in accordance with the present invention.
Figure 2B:
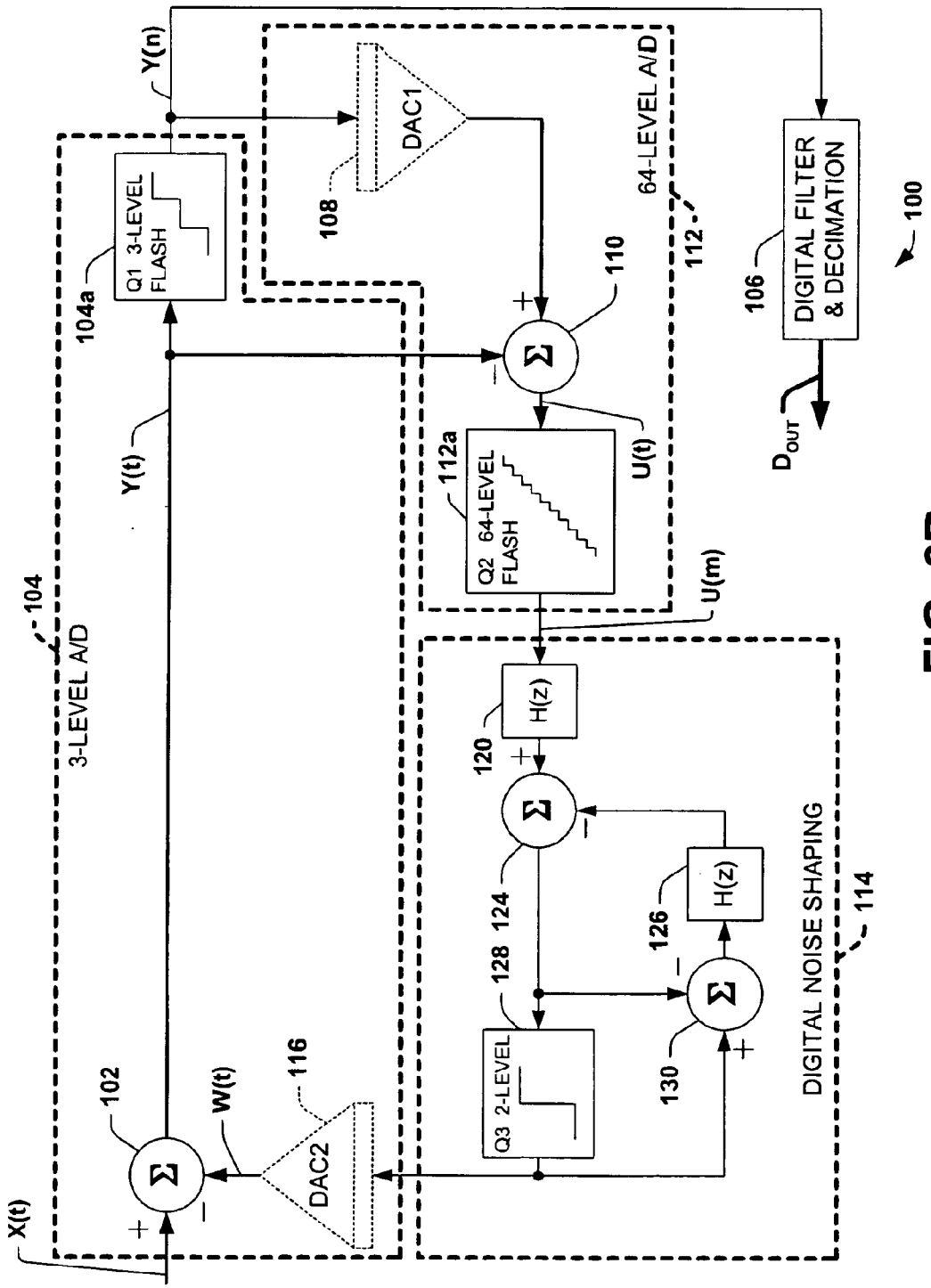
FIG. 2B is a schematic diagram illustrating further details of the exemplary system of FIG. 2A.

Referring initially to FIGS. 2A and 2B, the system 100 receives the analog converter input signal $X(t)$, which can be of any amplitude and can be single-ended or differential. The system 100 converts the analog input $X(t)$ to digital form and provides a multi-bit digital output signal $D_{OUT}$ for use in discerning and operating on information contained in the analog input X(t) (e.g., wireless communication signal). As illustrated in FIG. 2A, the system 100 receives the input signal X(t) and a noise shaped feedback signal W(t) at a first summer or summation node 102 in a forward signal path of a delta sigma modulator. The system 100 also includes a first A/D converter or quantizer 104 receiving the summed signal Y(t) and providing a single or multi-bit first quantized output Y(n) at a sampling rate Fs which is higher than the Nyquist rate for the bandwidth of the input signal X(t) (e.g., oversampling).

The first quantized output Y(n) is then provided to a digital filter and decimation system 106 that filters Y(n) to produce a sequence of digital values (e.g., A/D converter output) $D_{OUT}$. The system 106 reduces undesirable noise in the digital signal Y(n) and performs decimation by resampling the signal Y(n) at a lower rate to remove redundant signal information introduced by the oversampling process to provide the multi-bit system digital output $D_{OUT}$ representative of the system analog input. The digital decimation system 106 may be constructed using any digital logic and/or analog circuitry within the scope of the invention.

The exemplary first quantizer 104 comprises a 3-level flash A/D converter 104a (FIG. 2B) providing a 3-level thermometer coded first quantizer output Y(n) representative of the system analog input X(t), although any digital-to-analog converter or quantizer type may be employed within the scope of the invention, including a simple comparator providing a 2-level output. In the exemplary implementation, the output Y(n) can be three thermometer encoded (e.g., two-level) signals or a single voltage signal having one of three values. This particular implementation may be provided by a switched capacitor circuit 108 (e.g., D/A converter) associated with a high-resolution A/D converter or second quantizer 112 to generate a single 3-level signal, as illustrated further in FIGS. 2B–3C below. Alternatively, as shown in FIG. 2A, such a switched capacitor circuit could be implemented at the output of the first quantizer 104 or may be omitted, wherein the output Y(n) can be directly employed for digital error correction feedback (e.g., −vref, 0, or +vref, where +vref and −vref are reference voltages in the system 100).

The system 100 further comprises a second quantizer or A/D converter 112 and a digital noise shaping system 114 providing the feedback signal W(t) to the summer 102. The second quantizer 112 receives the signal U(t) and the converted (e.g., 3-level analog) signal Y(n) via a summer 110 as shown in FIG. 2A, or alternatively, a first DAC 108 (FIG. 2B) can provide an analog version of the first quantized output Y(n) to the summer 110. In the illustrated implementation, the second quantizer 112 comprises a high resolution flash A/D converter 112a receiving an analog signal U(t) from the summer 110 and providing a 64-level second quantized output U(m) to the digital noise shaping system 114. In one possible circuit implementation illustrated further in FIGS. 2B and 3C, the second quantizer 112 can be fashioned as one switched capacitor digital circuit, including the 64-level flash A/D converter 112a, the summer 110, and a 3-level DAC 108.

As the signal U(t) is the difference between the input and output of the first quantizer 104, the second quantized output U(m) is representative of the quantization error of the first quantizer 104. This converted quantization error signal U(m) is then noise shaped digitally in the system 114 and provided as the noise shaped feedback signal W(t). Other second quantizers 112 are possible within the scope of the invention, for example, having M levels, where M can be any positive integer, including M greater than 64. As discussed further below, the system 100 provides bandpass noise shaping with respect to the quantization error of the first quantizer 104, wherein the number of levels M of the second quantizer 112 sets the noise floor of the system 100. In this regard, higher order second quantizers 112 may advantageously lower the noise floor of the system 100.

As further illustrated in FIG. 2B, the exemplary digital noise shaping system 114 comprises filtering components 120 and 130 implementing a digital bandpass transfer function H(z) and a 2-level third quantizer 128 in an error feedback arrangement to form a digital bandpass filter system, where the quantizer 128 provides the noise shaped feedback signal W(t) having one of two-levels (e.g., −vref or +vref). Other implementations are possible, wherein the output of the digital noise shaping system 114 may be higher order, wherein a second DAC 116 may be included in the first quantizer 104 or in the noise shaping system 114 to provide an analog feedback signal W(t). In one possible circuit implementation illustrated further in FIGS. 3A and 3B, the first quantizer 104 can be constructed as one switched capacitor digital circuit, including the 3-level flash A/D converter 104a, the summer 102, and a DAC 108, or the DAC 108 can be omitted altogether.

As illustrated in FIG. 2B, the digital noise shaping system 114 comprises a first digital bandpass filter H(z) 120 coupled with the second quantizer 112, where the filter 120 provides a first filtered output to a summer 124 according to the second quantized output U(m). The third quantizer 128 is coupled with the filters 120 and 126 via summers 124 and 126, and provides the noise shaped feedback signal W(t) according to the first filtered output and according to a filtered feedback from the second H(z) bandpass filter 126. The second digital bandpass filter 126 provides the filtered feedback according to the noise shaped feedback signal W(t) and according to the first filtered signal via the summer 130.

In accordance with an aspect of the invention, the filter poles and zeros of the digital bandpass filter system are variable or programmable, thereby allowing the bandwidth and/or the center frequency of the passband to be adjusted. This programmability facilitates selective adaptation of the A/D conversion system 100 to one or more different standards, such as GSM, CDMA, WCDMA, etc. for mobile communications applications, including selectively changing the passband center frequency (e.g., for GSM channel switching) and/or the bandwidth (e.g., for changing from GSM to CDMA or WCDMA applications). In this regard, it is noted that the digital noise shaping system 114 can be constructed using any digital circuitry, for example, using switched capacitor and comparator circuits to implement the third quantizer 128, the summing nodes 124 and 130, and the bandpass filter circuits (e.g., H(z)) 120 and 126. For example, the circuits 120 and 126 may be constructed to implement a difference equation wherein the difference equation coefficients are adjustable in order to change the filter pole and/or zero locations (e.g., and hence to change the passband center frequency and/or bandwidth). In one preferred implementation, moreover, the digital noise shaping system 114 provides adjustable pole and zero locations by including a plurality of digital bandpass filter systems having different (e.g., predetermined) pole and zero locations, with multiplexed outputs as illustrated further in FIG. 3D.

Figure 3A:
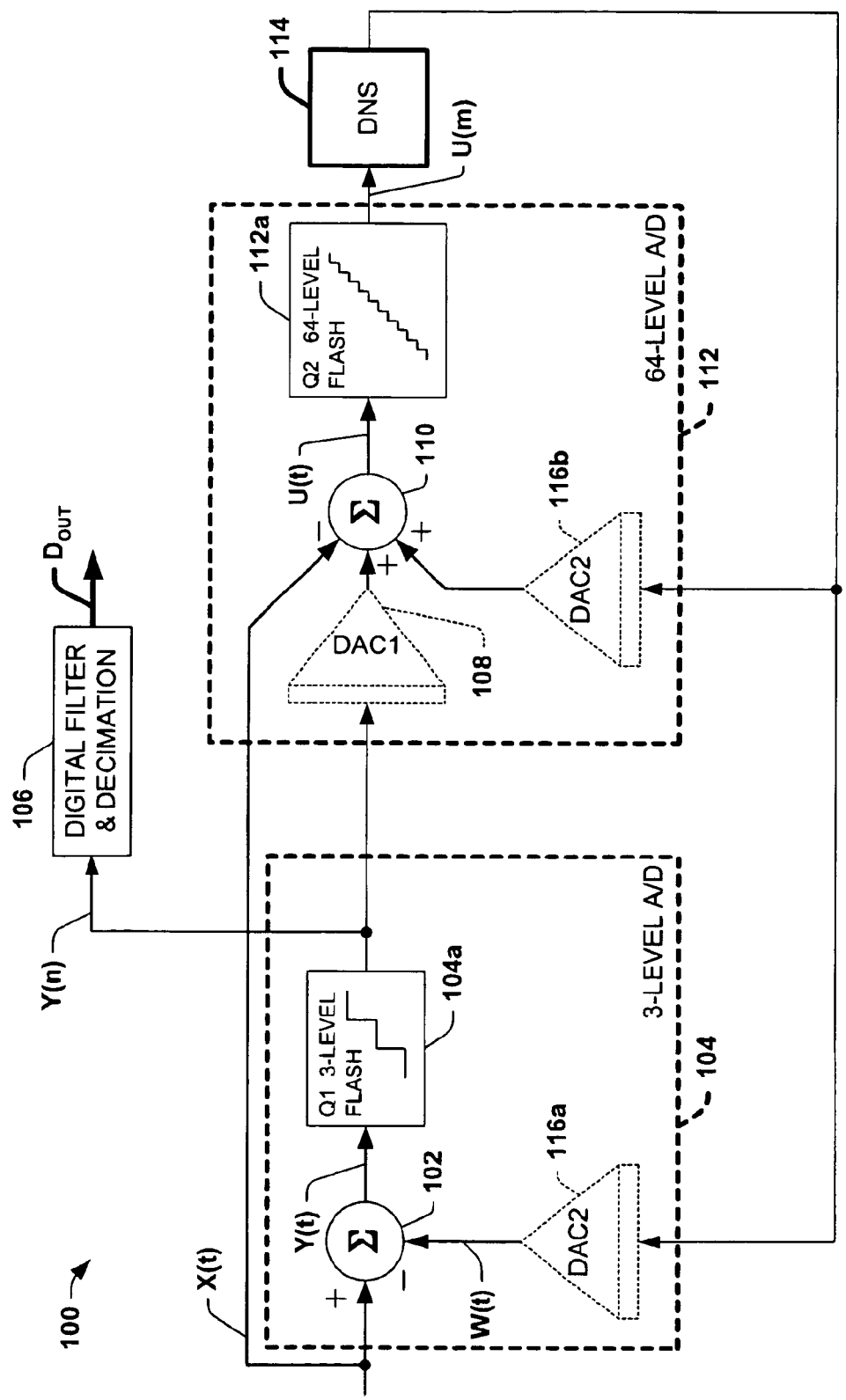
FIGS. 3A–3D are schematic diagrams illustrating an exemplary circuit implementation of the system of FIGS. 2A and 2B.

Referring also to FIGS. 3A–3D, one possible circuit implementation is illustrated for the exemplary system 100. As shown in FIG. 3A, the system 100 can be implemented in three primary switched capacitor circuits including a 3-level A/D first quantizer circuit 104, a 64-level second quantizer circuit 112, and a digital noise shaping system switched capacitor circuit 114. The digital filter and decimation system 106 is provided to create the final A/D output $D_{OUT}$, and the system 100 can be operated at a fixed sampling frequency (e.g., 80 MHz) via any suitable clock circuit (not shown). Depending on the number of levels in the output of the digital noise shaping system 114, the first and second quantizer circuits 104 and 112 may include DACs 116a and 116b, or a single DAC 116 could be provided in the noise shaping system circuit 114, or these may be omitted. Similarly, depending on the number of levels in the first quantized output Y(n), the DAC 108 may be provided in either of the first and second quantizer circuits 104 or 112, or may be omitted.

Figure 3B:
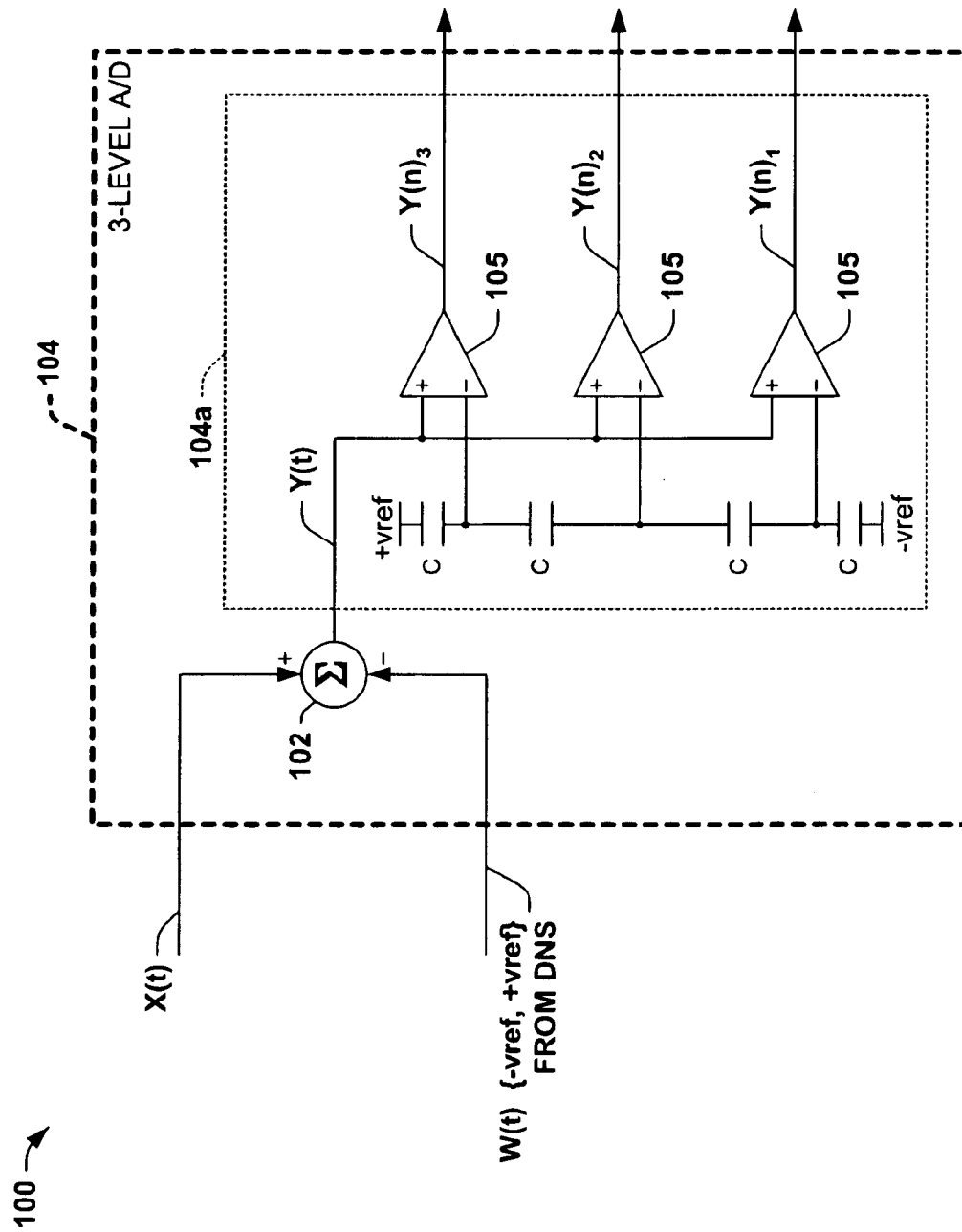

As illustrated in FIG. 3B, the exemplary first quantizer 104 may simply include a switched capacitor summing circuit 102 (e.g., a subtractor in this case) receiving the system analog input X(t) and the 2-level noise shaped feedback signal W(t) from the digital noise system 114, along with a three-level flash type A/D converter 104a. The exemplary flash circuit 104a is constructed using three comparators 105 and a capacitive divider circuit, each of which is easily created in standard CMOS fabrication processes. The positive terminals of the comparators are coupled to the difference signal Y(t) and the negative terminals are coupled to different voltage taps in the capacitive divider, whereby the resulting set of three comparator outputs $Y(n)_1$, $Y(n)_2$, and $Y(n)_3$ provide a thermometer coded digital first quantized output Y(n) representing the analog signal Y(t).

Figure 3C:
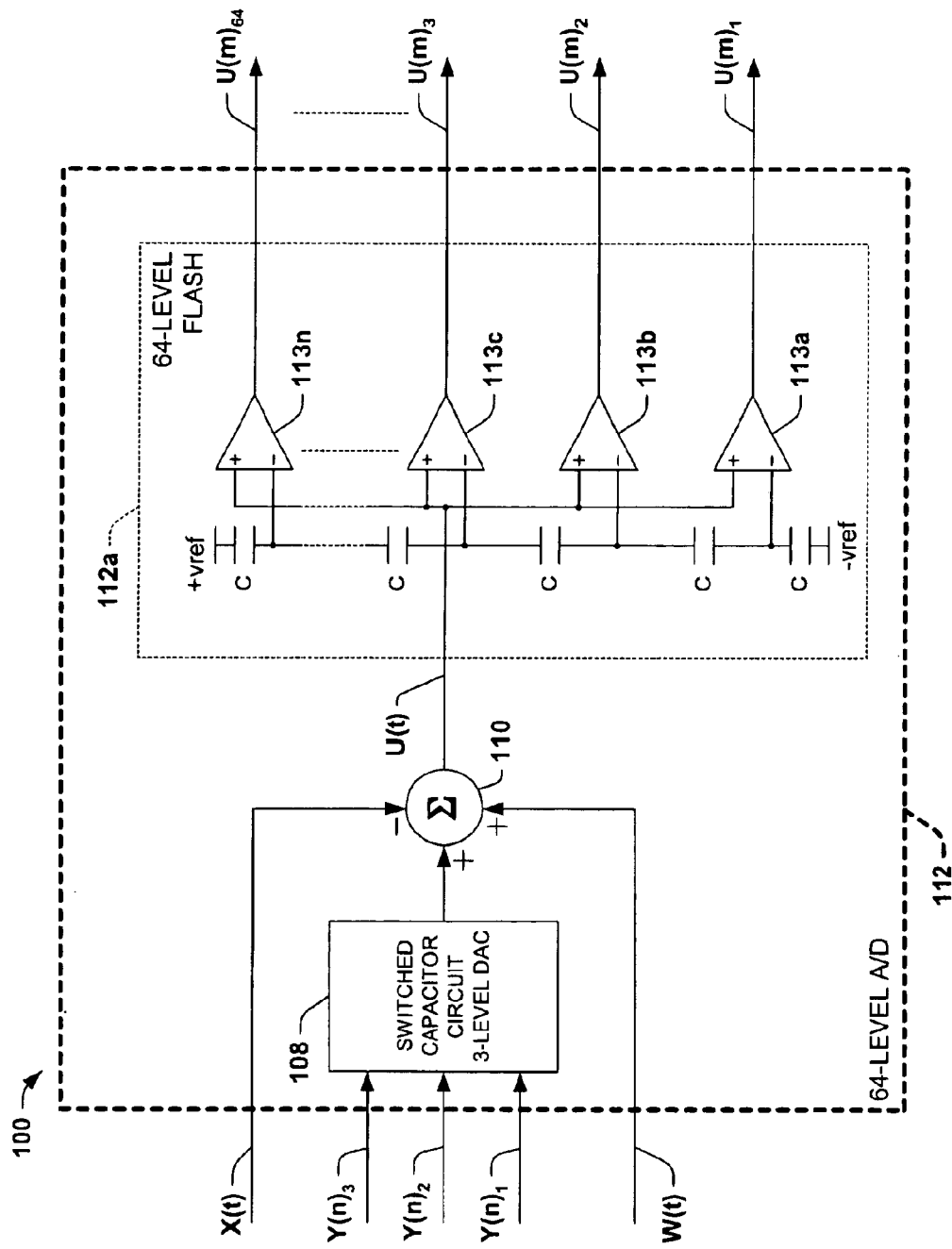

Referring also to FIG. 3C, the three signal first quantized output Y(n) is provided to a switched capacitor 3-level DAC circuit 108 in the second quantizer 112. The circuit 108 can be any circuit that provides an analog representation of Y(n), for example, where the output of the circuit 108 has one of three voltage values (e.g., −vref, 0, or +vref). This output is provided to a switched capacitor summing circuit 110 together with the system analog input X(t) and the noise shaped (e.g., two-level digital) feedback signal W(t). The summer analog output voltage U(t) is provided to the positive terminals of 64 comparators 113a–113n in a 64-level flash A/D circuit 112a. The negative comparator terminals are coupled with individual voltages tapped from a capacitive voltage divider, wherein the outputs U(m), through $U(m)_{64}$ provide a thermometer coded digital second quantized output U(m) representing the analog signal U(t). Although illustrated and described as a single ended circuits, the first quantizer circuit 104 and the 64-level second quantizer 112 can alternatively be implemented to accommodate differential analog signals within the scope of the invention. In addition, while the circuits 104, 112, and 114 can be implemented as switched capacitor, logic gate, and comparator circuits, any or all of these may alternatively be constructed using any suitable circuits or subsystems within the scope of the present invention.

Figure 3D:
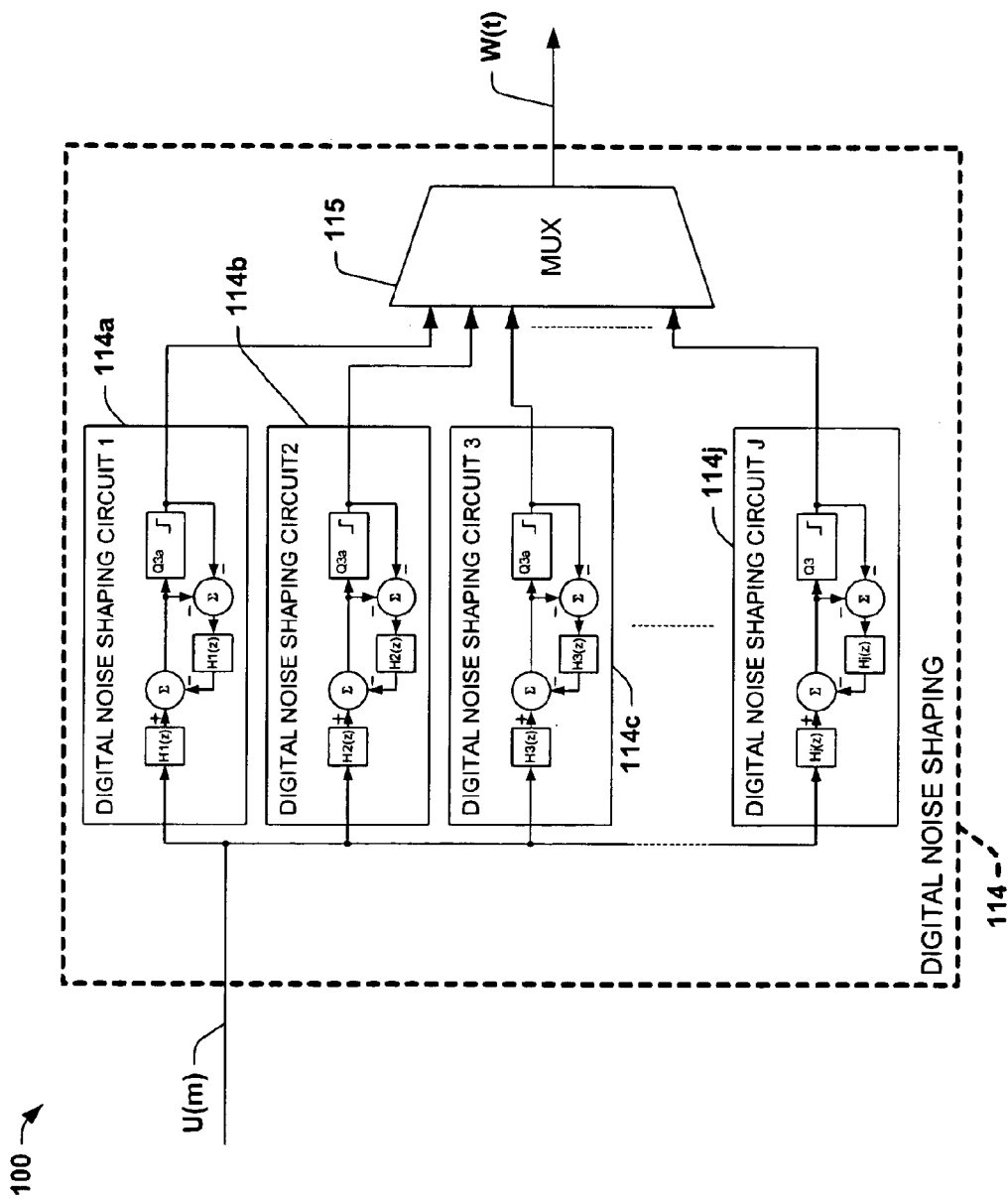

Referring also to FIG. 3D, the exemplary digital noise shaping system 114 has selectable or variable bandpass filter pole and zero locations in order to facilitate center frequency adjustment (e.g., such as in GSM channel switching) and/or to facilitate adjusting the width of the passband (e.g., changing from narrow band to wideband operation). In the exemplary digital noise shaping system 114, this is accomplished by including a plurality of digital bandpass filter systems 114a through 114j having different filter pole and zero locations (e.g., where j is any positive integer). The systems 114a–114j may be of any order, and can be constructed using any suitable circuitry, such as switched capacitor circuits and logic gates within the scope of the invention.

The digital bandpass filter systems 114a–114j are coupled to receive the second quantized output U(m) and to provide corresponding bandpass noise shaping thereof. The systems 114a–114j create corresponding digital noise shaped feedback signals (e.g., 2-level signals in this example), which are provided as inputs to a selection circuit or multiplexer 115 in the digital system 114. As described above in connection with FIG. 2B, the plurality of digital bandpass filter systems 114a–114j individually comprise first and second bandpass filters H(z) (e.g., filters 120 and 126 in FIG. 2B above) and a quantizer Q3 (e.g., 2-level third quantizer 128 in FIG. 2B). The multiplexer 115 may be any type of digital or other circuitry within the scope of the invention which provides the noise shaped feedback signal W(t) according to a selected one of the digital bandpass filter systems 114a–114j, wherein the selection may be made by a select signal provided to the multiplexer 115 by any decisional component in a communications device or other system in which the A/D converter 100 is employed (not shown).

The conversion system 100 can thus be employed to address multiple bands, for example, to switch between channels in GSM applications through selection of appropriately tuned digital bandpass filter systems 114a–114j using the multiplexer 115, while being operated with a fixed sampling clock (e.g., without requiring a variable PLL as in the conventional design of FIG. 1B). The system 100 also facilitates selection of narrow or wideband operation, for example, where certain of the filter systems 114a–114j can be designed for narrow bandwidths (e.g., 200 kHz) and others for wider bands (e.g., 1 MHz). Furthermore, because the noise shaping is performed digitally, the system 100 is constructed without amplifiers and inductors, thereby facilitating improved linearity, low power consumption, low voltage swings, and reduced circuit area.

As shown in FIGS. 2B, 3A, and 3D, the noise transfer function provided by the selected digital bandpass filter system is given by the following equation 1:

$$Y(z)=X(z)+(1-H(z))E1(z)-(1-H(z))E3(z)-H(z)E2(z),$$

where E1(z), E2(z), and E3(z) are the quantization errors of the first, second, and third quantizers 104a, 112a, and 128, respectively. Thus, the selected H(z) in the digital noise shaping system 114 provides bandpass noise shaping with respect to the quantization errors associated with the first and third quantizers 104a and 128, wherein the number of levels (e.g., 64) provided by the second quantizer 112a sets the noise floor of the system 100 in the selected passband. As can be seen in the noise shaping transfer function of equation 1, E1 and E3 are bandpass noise shaped by (1-H(z)). Furthermore, since E2 is associated with the high-level quantization of the second quantizer 112a, the noise floor within the selected passband can be tailored to meet a given performance specification (e.g., for GSM, CDMA, WCDMA, or other standard of interest).

Figure 4A:
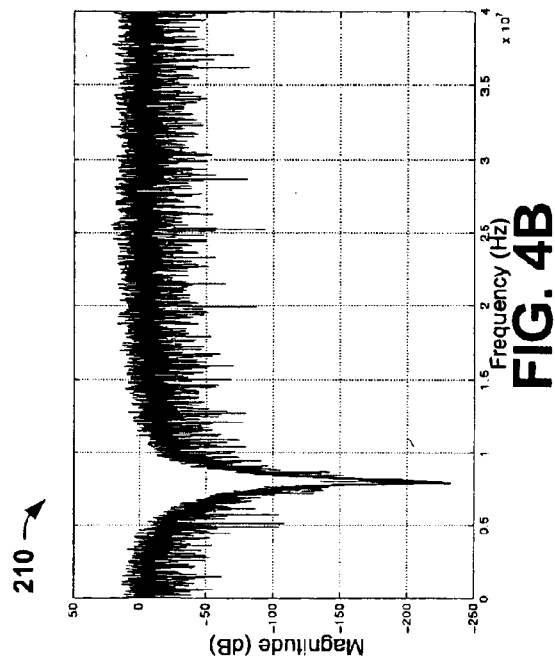
FIGS. 4A–5B are magnitude vs. frequency plots illustrating simulated GSM performance of the system of FIGS. 2A–3D.
Figure 4B:
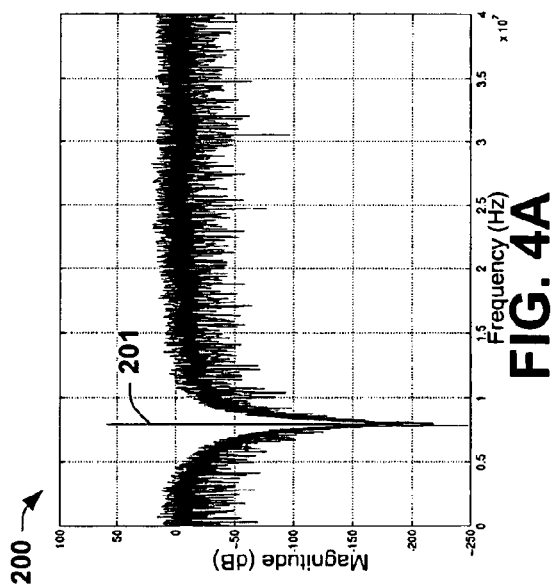

Referring now to FIGS. 4A–6E, the exemplary programmable bandpass delta sigma A/D conversion system 100 was simulated to illustrate the frequency response characteristics that may be achieved using the digital noise shaping aspects of the invention. FIGS. 4A–4E illustrate the system performance (e.g., amplitude (dB) vs. frequency (Hz) for GSM applications. FIGS. 4A and 4B illustrate plots 200 and 210, respectively, showing performance for a 200 kHz wide GSM channel centered at 8.0 MHz with a sampling frequency of 80 MHz, where the selected noise transfer function filter zeros are located at the center and edges of the passband (e.g., at 7.9, 8.0, and 8.1 MHz).

Figure 4C:
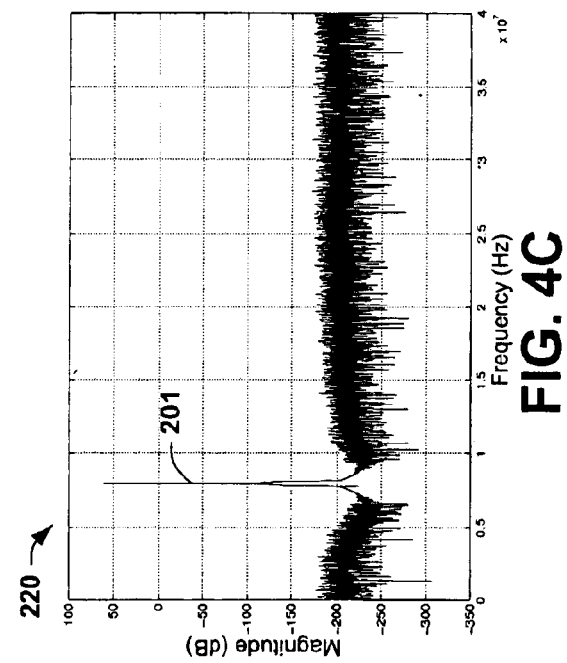
Figure 4D:
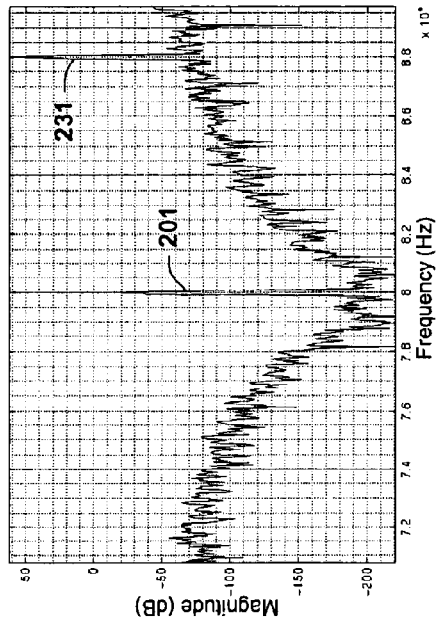
Figure 4E:
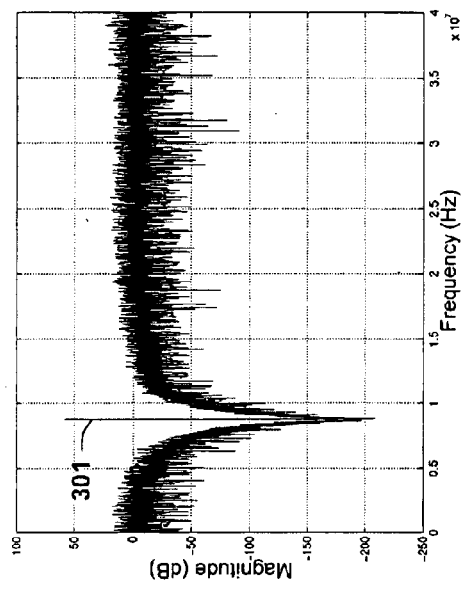

The plot 200 in FIG. 4A shows a signal 201 at 8.0 MHz within the passband with no external filtering, wherein signal to noise plus distortion ratio (SNDR) performance of 93.765 dB is achieved. The plot 210 shows the quantization error of the system 100 without the signal 201, wherein the bandpass noise shaping reduces the in-band quantization noise according to the transfer function of equation 1, with the noise floor in the band being determined by the quantization resolution of the second quantizer 112a (e.g., 64-levels in this example). FIG. 4C shows a plot 220 of the system performance for the same signal 201, where a pre-converter bandpass filter (e.g., filter 6 is the receiver system 2 of FIG. 1A) is used to pre-filter the channel. FIGS. 4D and 4E illustrate plots 230 and 240, respectively, showing system performance for the 8.0 MHz signal 201 in the presence of a strong interferer 231 at 8.8 MHz.

Figure 5A:
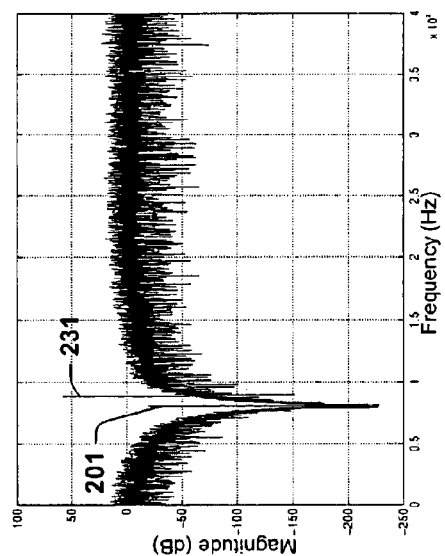
Figure 5B:
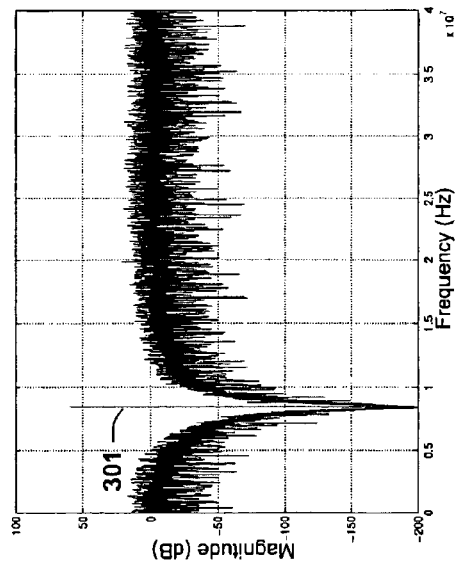

FIGS. 5A and 5B provide plots 300 and 310 showing system performance for different selected 200 kHz passbands centered at 8.4 MHz and 8.8 MHz, respectively. As discussed above, the channel selection in the exemplary system 100 is accomplished by simply selecting a corresponding one of the digital bandpass filter systems 114a–114j using the multiplexer 115 of FIG. 3D. In the plot 300 of FIG. 5A, a signal tone 301 is located at the center of the band at 8.4 MHz, where the selected digital bandpass filter system has noise transfer function filter zeros at 8.3, 8.4, and 8.5 MHz, whereat the system 100 achieves an SNDR of 93.568 dB. In FIG. 5B, a signal 311 is located at the center of another band centered at 8.8 MHz, where the filter zeros are located at 8.7, 8.8, and 8.9 MHz. In this case, an SNDR of 94.021 is achieved in the system 100. It is noted that in the simulations of FIGS. 4A–4E, a fixed sampling frequency of 80 MHz was employed throughout, wherein the selection of different GSM channels (e.g., centered at 8.0, 8.4, and 8.8 MHz in FIGS. 4A, 5A, and 5B, respectively) does not significantly degrade SNDR performance.

Figure 6A:
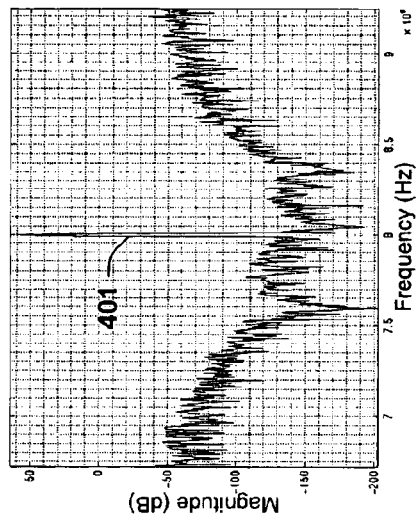
FIGS. 6A–6C are magnitude vs. frequency plots illustrating simulated CDMA performance of the system of FIGS. 2A–3D.
Figure 6B:
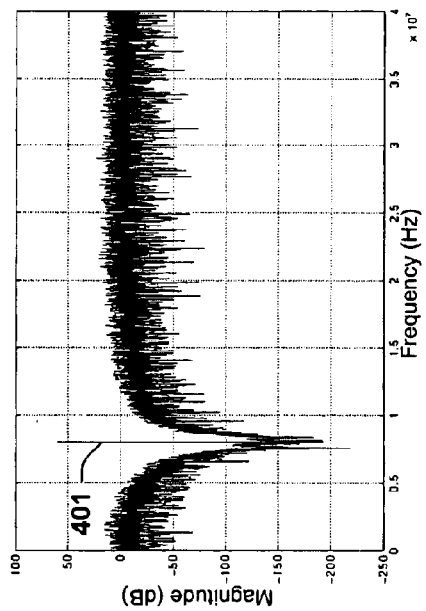
Figure 6C:
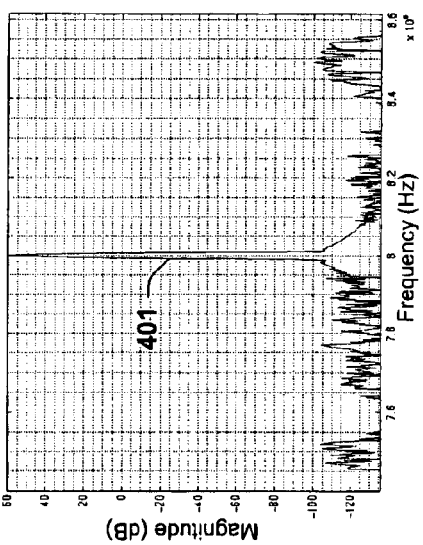

Referring also to FIGS. 6A–6E, selecting another of the noise shaping digital bandpass filter systems 114a–114j allows use of the same system 100 for wider passbands, using the same fixed sampling frequency of 80 MHz. FIGS. 6A and 6B illustrate plots 400 and 410, respectively, showing performance for a CDMA band having a bandwidth of 1 MHZ centered at 8.0 MHz, wherein the selected noise transfer function filter zeros are located at the center and edges of the passband. In the plots 400 and 410, a signal 401 is located at 8.0 MHz within the passband with no external filtering, where the SNDR performance is 68 dB. FIG. 6C shows a plot 420 of the system performance for the same signal 401, with a pre-converter bandpass filter to pre-filter the channel.

Figure 6E:
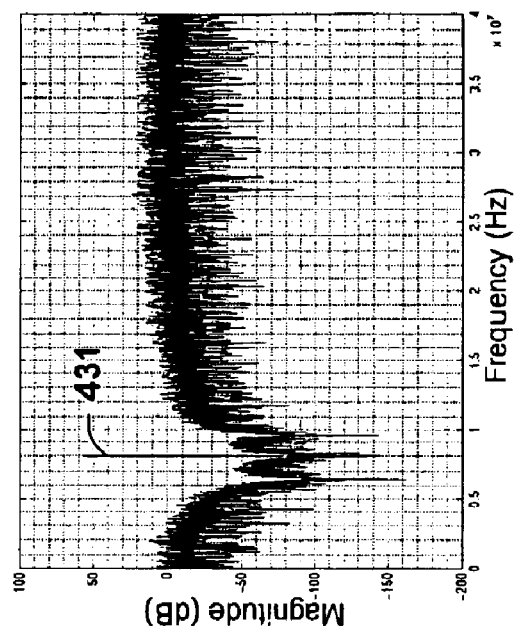
FIGS. 6D and 6E are magnitude vs. frequency plots illustrating simulated WCDMA performance of the system of FIGS. 2A–3D.
Figure 6D:
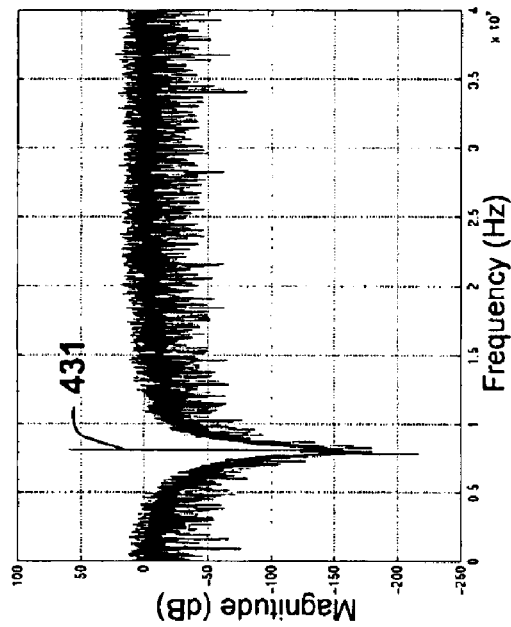

FIGS. 6D and 6E illustrate wideband CDMA (WCDMA) performance plots 430 and 440, respectively, for 4 MHz wide passbands centered at 8.0 MHz, again using a sampling frequency of 80 MHz. In the example of FIG. 6D, the bandpass filer zeros are located at the center and edges of the passband, whereas in FIG. 6E, all three filter zeros are located at the center frequency of 8.0 MHz. For a signal 431 at 8.0 MHz, the filter design in FIG. 6D achieves an SNDR of 43.55 dB, and the filter of FIG. 6E achieves an SNDR of 44.72 dB, both of which are acceptable for WCDMA applications. Thus, the above simulation results show the flexibility of the programmable systems of the invention, wherein a simple cost effective delta sigma based bandpass A/D converter can accommodate multiple applications and multiple channels within a given application for wireless or other products where A/D conversion is needed.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An analog to digital conversion system, comprising:
  a first quantizer providing a first quantized output responsive to a system analog input summed with an analog noise shaped feedback signal;
  a second quantizer and providing a second quantized output responsive to the summed analog version of the first quantized output, and the system analog input; and
  a digital noise shaping system responsive to the output of the second quantizers and providing the noise shaped feedback signal from the second quantized output.

2. An analog to digital conversion system, comprising:
  a first quantizer providing a first quantized output according to a system analog input and according to a noise shaped feedback signal;
  a second quantizer coupled with the first quantizer and providing a second quantized output according to the first quantized output, the system analog input, and the noise shaped feedback signal; and
  a digital noise shaping system coupled with the first and second quantizers and providing the noise shaped feedback signal according to the second quantized output, the noise shaped feedback signal being noise shaped by the digital noise shaping system with respect to a quantization error associated with the first quantizer;
  wherein the first quantizer is an N-level A/D converter providing the first quantized output having one of N discrete levels, wherein the second quantizer is an M-level A/D converter providing the second quantized output having one of M discrete levels, M and N being integers greater than 1, and wherein N is less than M.

3. The system of claim 2, wherein N is 3 or more and M is 64 or more.

4. The system of claim 1, wherein the second quantizer is an M-level A/D converter providing the second quantized output having one of M discrete levels, and wherein the number of levels M of the second quantizer determines a noise floor of the analog to digital conversion system.

5. The system of claim 1, wherein the first and second quantizers are flash A/D converters.

6. The system of claim 1, wherein the first and second quantizers individually comprise switched capacitor circuits.

7. The system of claim 1, wherein the digital noise shaping system comprises a switched capacitor circuit.

8. The system of claim 7, wherein the digital noise shaping system comprises a digital bandpass filter system.

9. The system of claim 1, wherein the digital noise shaping system comprises a digital bandpass filter system.

10. An analog to digital conversion system, comprising:
a first quantizer providing a first quantized output according to a system analog input and according to a noise shaved feedback signal;
a second quantizer coupled with the first quantizer and providing a second quantized output according to the first quantized output the system analog input, and the noise shaped feedback signal; and
a digital noise shaping system coupled with the first and second quantizers and providing the noise shaped feedback signal according to the second quantized output, the noise shaped feedback signal being noise shaped by the digital noise shaping system with respect to a quantization error associated with the first quantizer;
wherein the digital noise shaping system comprises a digital bandpass filter system;
wherein the digital bandpass filter system comprises:
a first digital bandpass filter coupled with the second quantizer and providing a first filtered output according to the second quantized output;
a third quantizer coupled with the first and second quantizers and providing the noise shaped feedback signal according to the first filtered output and according to a filtered feedback; and
a second digital bandpass filter coupled with the first digital bandpass filter and with the third quantizer, the second digital bandpass filter providing the filtered feedback according to the noise shaped feedback signal and according to the first filtered signal.

11. The system of claim 9, wherein the noise shaped feedback signal is noise shaped by the digital noise shaping system with respect to a quantization error associated with the first quantizer.

12. The system of claim 1, wherein the digital noise shaping system comprises:
a plurality of digital bandpass filter systems coupled with the second quantizer, the digital bandpass filter systems having different filter pole and zero locations; and
a multiplexer coupled between the digital bandpass filter systems and the first quantizer, the multiplexer providing the noise shaped feedback signal according to a selected one of the digital bandpass filter systems.

13. The system of claim 12, wherein the plurality of digital bandpass filter systems individually comprise:
a first digital bandpass filter coupled with the second quantizer and providing a first filtered output according to the second quantized output;
a third quantizer coupled with the first and second quantizers and providing the noise shaped feedback signal according to the first filtered output and according to a filtered feedback; and
a second digital bandpass filter coupled with the first digital bandpass filter and with the third quantizer, the second digital bandpass filter providing the filtered feedback according to the noise shaped feedback signal and according to the first filtered signal.

14. The system of claim 13, wherein the noise shaped feedback signal is noise shaped by the digital noise shaping system with respect to a quantization error associated with the first quantizer.

15. The system of claim 1, wherein the noise shaped feedback signal is noise shaped by the digital noise shaping system with respect to a quantization error associated with the first quantizer.

16. A bandpass delta sigma modulator, comprising:
a first quantizer providing a first quantized output responsive to a system analog input and a noise shaped feedback signal; and
a digital error feedback system coupled to the first quantizer and providing the noise shaped feedback signal responsive to the first quantized output and including a second quantizer coupled to the first quantizer and providing a second quantized output responsive to the first quantized output, the system analog input, and the noise shaped feedback signal; and
a digital noise shaping system coupled to the first and second quantizers and providing the noise shaped feedback signal.

17. The bandpass delta sigma modulator of claim 16, wherein the digital noise shaping system comprises a digital bandpass filter system.

18. The bandpass delta sigma modulator of claim 17, wherein the digital bandpass filter system comprises programmable poles and zeros.

19. The bandpass delta sigma modulator of claim 17, wherein the digital bandpass filter system comprises:
a first digital bandpass filter coupled with the second quantizer and providing a first filtered output according to the second quantized output;
a third quantizer coupled with the first and second quantizers and providing the noise shaped feedback signal according to the first filtered output and according to a filtered feedback; and
a second digital bandpass filter coupled with the first digital bandpass filter and with the third quantizer, the second digital bandpass filter providing the filtered feedback according to the noise shaped feedback signal and according to the first filtered signal.

20. The bandpass delta sigma modulator of claim 17, wherein the noise shaped feedback signal is noise shaped by the digital noise shaping system with respect to a quantization error associated with the first quantizer.

21. The bandpass delta sigma modulator of claim 17, wherein the digital noise shaping system comprises:
a plurality of digital bandpass filter systems coupled with the second quantizer, the digital bandpass filter systems having different filter pole and zero locations; and
a multiplexer coupled between the digital bandpass filter systems and the first quantizer, the multiplexer providing the noise shaped feedback signal according to a selected one of the digital bandpass filter systems.

* * * * *